(12) United States Patent
Sato

(10) Patent No.: US 10,642,295 B2
(45) Date of Patent: May 5, 2020

(54) POWER SUPPLY CONTROL CIRCUIT, WIRELESS MODULE, AND SIGNAL TRANSMITTER

(71) Applicant: FUJITSU LIMITED, Kawasaki-shi, Kanagawa (JP)

(72) Inventor: Hiroyuki Sato, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/056,040

(22) Filed: Aug. 6, 2018

(65) Prior Publication Data
US 2019/0064861 A1 Feb. 28, 2019

(30) Foreign Application Priority Data
Aug. 25, 2017 (JP) .................................. 2017-162379

(51) Int. Cl.
*G05F 1/571* (2006.01)
*H04B 1/04* (2006.01)
(Continued)

(52) U.S. Cl.
CPC ............. *G05F 1/571* (2013.01); *G01R 31/40* (2013.01); *H02H 7/1213* (2013.01); *H02J 7/00* (2013.01);
(Continued)

(58) Field of Classification Search
CPC .......... G05F 1/571; H04B 1/04; H02J 7/0052; H02J 50/30; H02J 7/345; G01R 31/40;
(Continued)

(56) References Cited

U.S. PATENT DOCUMENTS 7,508,248 B2 * 3/2009 Yoshida .................... H02J 7/32
327/365
9,282,512 B2 * 3/2016 Iwabuchi .......... H04W 52/0206
(Continued)

FOREIGN PATENT DOCUMENTS

JP 2012-253621 A 12/2012

OTHER PUBLICATIONS

Received STIC search report from EIC 2800 seacher John DiGeronimo on Oct. 30, 2018 for claim 2. (Year: 2018).*
(Continued)

*Primary Examiner* — Nguyen Tran
*Assistant Examiner* — Htet Z Kyaw
(74) *Attorney, Agent, or Firm* — Fujitsu Patent Center

(57) ABSTRACT

A power supply control circuit includes a power storage that stores power generated by energy harvesting, a function circuit that operates a specific function, a first switch allocated between the power storage and the function circuit and supplies or not supplies the power to the function circuit, a supply controller that monitors a voltage corresponding to the power stored in the power storage, and when the voltage of the power storage is equal to or above a first voltage, controls the first switch so that the function circuit is supplied with the power stored in the power storage, and a power consumption controller that controls, based on the voltage of the power storage, power to be consumed by the function circuit, the power being supplied from the power storage to the function circuit by switching of the first switch.

7 Claims, 14 Drawing Sheets

(51) Int. Cl.
  *G01R 31/40* (2020.01)
  *H02H 7/12* (2006.01)
  *H03K 17/74* (2006.01)
  *H02J 7/34* (2006.01)
  *H02J 50/30* (2016.01)
  *H02J 7/35* (2006.01)
  *H02J 50/20* (2016.01)
  *H02J 7/02* (2016.01)
  *H02J 7/00* (2006.01)
  *H03K 17/30* (2006.01)

(52) U.S. Cl.
  CPC .............. *H02J 7/025* (2013.01); *H02J 7/345* (2013.01); *H02J 7/35* (2013.01); *H02J 50/20* (2016.02); *H02J 50/30* (2016.02); *H03K 17/74* (2013.01); *H04B 1/04* (2013.01); *H03K 2017/307* (2013.01)

(58) Field of Classification Search
  CPC . H03K 17/74; H03K 2017/307; H02H 7/1213
  USPC ........................................................ 323/299
  See application file for complete search history.

(56) References Cited

U.S. PATENT DOCUMENTS

| | | | | |
|---|---|---|---|---|
| 9,614,435 | B1 * | 4/2017 | Hsieh | H02M 3/07 |
| 9,660,485 | B2 * | 5/2017 | Naskali | H02J 9/06 |
| 9,673,635 | B2 * | 6/2017 | Sequeira | H02J 5/005 |
| 10,063,081 | B2 * | 8/2018 | Kruiskamp | H02J 7/0068 |
| 10,374,457 | B2 * | 8/2019 | Furukawa | H02J 7/0068 |
| 2011/0141770 | A1 * | 6/2011 | Wilson | H02M 5/29 363/16 |
| 2014/0087738 | A1 * | 3/2014 | Iwabuchi | H04W 36/0011 455/437 |
| 2014/0175880 | A1 * | 6/2014 | Miyanaga | H02J 1/102 307/29 |
| 2015/0179233 | A1 * | 6/2015 | Kimura | G11C 5/147 365/226 |
| 2015/0256062 | A1 * | 9/2015 | Shirahata | H02J 7/32 323/304 |
| 2016/0197508 | A1 * | 7/2016 | Kruiskamp | H02J 7/0068 307/130 |
| 2017/0279304 | A1 * | 9/2017 | Furukawa | H02J 7/0063 |
| 2017/0294691 | A1 * | 10/2017 | Yamamoto | H02J 7/0078 |
| 2019/0171277 | A1 * | 6/2019 | Satou | G06F 1/3296 |

OTHER PUBLICATIONS

Received STIC search report from EIC 2800 seacher John DiGeronimo on Oct. 29, 2018 for claim 5. (Year: 2018).*

Received STIC search report from EIC 2800 seacher John DiGeronimo on Oct. 26, 2018 for claim 7. (Year: 2018).*

* cited by examiner

POWER SUPPLY CONTROL CIRCUIT, WIRELESS MODULE, AND SIGNAL TRANSMITTER

CROSS-REFERENCE TO RELATED APPLICATION

This application is based upon and claims the benefit of priority of the prior Japanese Patent Application No. 2017-162379, filed on Aug. 25, 2017, the entire contents of which are incorporated herein by reference.

FIELD

The embodiments discussed herein are related to a power supply control circuit, a wireless module, and a signal transmitter.

BACKGROUND

Power supply by wiring may be unsuitable for some devices, such as sensors, that are installed at many outdoor locations. Thus, energy harvesting, which is a technique for generating power to be used for operation by use of environmental energy such as sun light, is being considered for application to devices installed at such locations. Energy harvesting is advantageous not only in increasing the flexibility of installation locations for power-using devices, but also in reducing carbon dioxide.

Energy generated by energy harvesting is, however, minute. In addition, with energy harvesting, it is difficult to supply stable energy because the amount of power generated and stored in a battery fluctuates depending on the environment. Since a circuit such as a processor or a sensor operates with stably-supplied power, in order for a processor or the like to operate using power generated by energy harvesting, a regulator such as a DC-DC converter or a low-dropout (LDO) regulator is used to stabilize power supplied to the processor or the like.

However, a regulator uses a diode for overvoltage protection, and the diode allows a leakage current to flow. Thus, a minute amount of power generated by energy harvesting and stored in a battery is consumed by the leakage current through the diode before voltage sufficient to operate a circuit such as a processor is reached. It is therefore difficult to operate the circuit such as a processor with a minute amount of power generated by energy harvesting.

It is conceivable to operate the circuit such as a processor with power generated by energy harvesting and stored in the battery without the intervention of the regulator. However, since the amount of power generated by energy harvesting fluctuates depending on the environment, when a large amount of power is generated, an excessive amount of power is stored in the battery, causing a voltage exceeding the withstand voltage of the circuit such as a processor to be supplied to the circuit such as a processor and hence breaking the circuit such as a processor.

The following is a reference document.
[Document 1] Japanese Laid-open Patent Publication No. 2012-253621.

SUMMARY

According to an aspect of the invention, a power supply control circuit includes a power storage that stores power generated by energy harvesting, a function circuit that operates a specific function, a first switch allocated between the power storage and the function circuit and supplies or not supplies the power to the function circuit, a supply controller that monitors a voltage corresponding to the power stored in the power storage, and when the voltage of the power storage is equal to or above a first voltage, controls the first switch so that the function circuit is supplied with the power stored in the power storage, and a power consumption controller that controls, based on the voltage of the power storage, power to be consumed by the function circuit, the power being supplied from the power storage to the function circuit by switching of the first switch.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments of a power supply control circuit, a wireless module, and a signal transmitter disclosed in the present application are described in detail based on the drawings. Note that the embodiments set forth below are not intended to limit the technique disclosed herein.

Embodiment 1

[Configuration of the Signal Transmitter 10]

Figure 1:
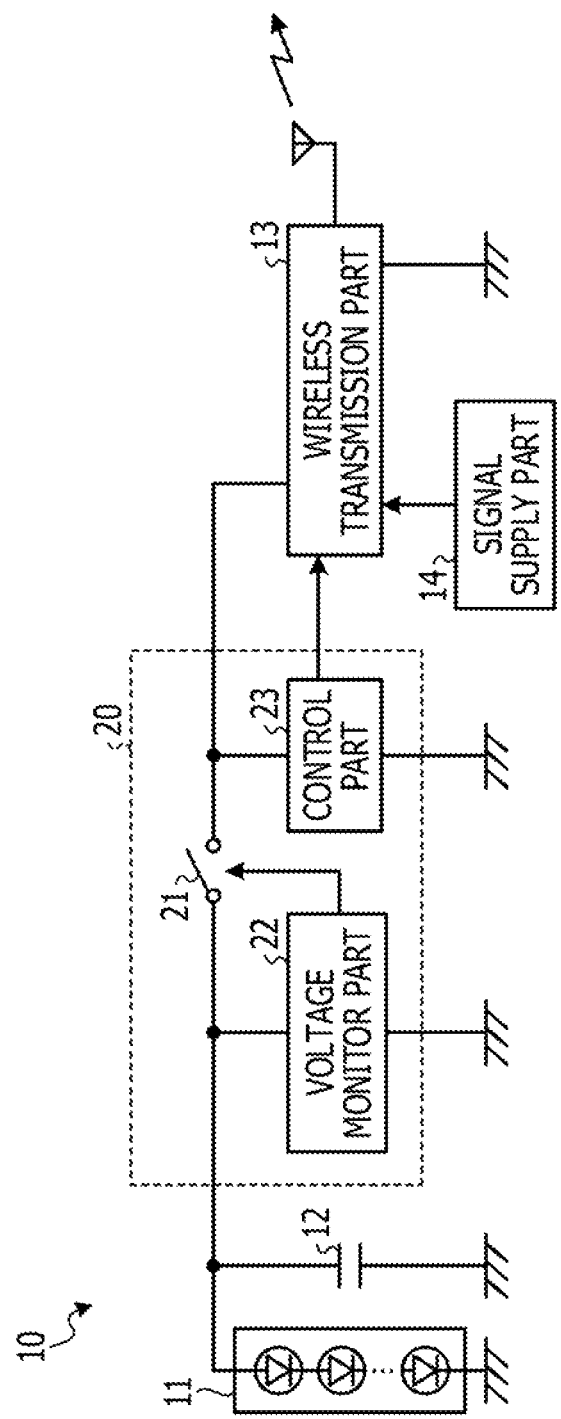
FIG. 1 is a block diagram illustrating an example of a signal transmitter according to Embodiment 1.

FIG. 1 is a block diagram illustrating an example of a signal transmitter 10 according to Embodiment 1. The signal transmitter 10 according to the present embodiment is a device that periodically transmits a predetermined signal, for example a beacon. Note that the signal transmitter 10 may be a wirelessly-communicable sensor device that sends a signal measured periodically by a sensor or the like by radio waves.

As illustrated in FIG. 1, the signal transmitter 10 has, for example, a power generation part 11, a power storage part 12, a wireless transmission part 13, a signal supply part 14, and a power supply control circuit 20. The power storage part 12, the wireless transmission part 13, and the power supply control circuit 20 are an example of a wireless module.

The power generation part 11 performs energy harvesting. In the present embodiment, the power generation part 11 has a plurality of photoelectric conversion elements, and generates power by converting light energy, which is environmental energy, into electrical energy in each of the photoelectric conversion elements. Note that the power generation part 11 may be a device that generates power using energy other than light, such as heat, vibration, or electromagnetic waves as long as the device generates power using environmental energy.

The power storage part 12 stores power generated by the power generation part 11. In the present embodiment, the power storage part 12 is a capacitor. Note that the power storage part 12 is not limited to a capacitor and may be a chemical battery or the like as long as its output voltage changes in accordance with power stored therein.

The wireless transmission part 13 wirelessly transmits a signal supplied from the signal supply part 14 in conformity with a wireless communication method such as Bluetooth low energy (BLE). Bluetooth is a registered trademark. The wireless transmission part 13 is an example of a functional circuit. The power supply control circuit 20 controls the timing at which the wireless transmission part 13 wirelessly transmits signals, the power of the radio waves by which the wireless transmission part 13 transmits the signals, and the like.

The signal supply part 14 supplies the wireless transmission part 13 with a signal to be wirelessly transmitted by the wireless transmission part 13. In the present embodiment, the signal supply part 14 is memory that retains an ID. The wireless transmission part 13 wirelessly transmits an ID supplied from the signal supply part 14. Note that the signal supply part 14 may be a sensor. For example, the sensor periodically collects a measured value and supplies the wireless transmission part 13 with a signal containing the measured value collected. The wireless transmission part 13 wirelessly transmits the signal supplied from the sensor to a predetermined destination at the timing instructed by a control part 23.

The power supply control circuit 20 has a first switch 21, a voltage monitor part 22, and the control part 23. The first switch 21 switches between supplying and not supplying the wireless transmission part 13 and the control part 23 with the power stored in the power storage part 12 by the power generation part 11. The voltage monitor part 22 controls the switching by the first switch 21. Hereinafter, the state where the first switch 21 is controlled so that power stored in the power storage part 12 may be supplied to the wireless transmission part 13 is referred to as an ON state, and the state where the first switch 21 is controlled so that power stored in the power storage part 12 may not be supplied to the wireless transmission part 13 is referred to as an OFF state. The first switch 21 is implemented by an element that allows little leakage current to flow in the OFF state, like a micro electro mechanical system (MEMS) switch or the like. The first switch 21 is an example of a switch part and a first switch part.

The voltage monitor part 22 monitors voltage of the power storage part 12, the voltage corresponding to the power stored in the power storage part 12. When the voltage of the power storage part 12 is equal to or above an activation voltage $V_A$, the voltage monitor part 22 controls the first switch 21 so that the control part 23 and the wireless transmission part 13 may be supplied with the power stored in the power storage part 12. When the voltage of the power storage part 12 is below a stop voltage $V_S$ which is lower than the activation voltage $V_A$, the voltage monitor part 22 controls the first switch 21 so that the control part 23 and the wireless transmission part 13 may not be supplied with the power stored in the power storage part 12. The voltage monitor part 22 is implemented by, for example, a comparator or the like. The voltage monitor part 22 is an example of a supply control part, and the activation voltage $V_A$ is an example of a first voltage.

Based on the voltage corresponding to the power stored in the power storage part 12, the control part 23 controls power to be consumed by the wireless transmission part 13, the power being supplied from the power storage part 12 to the wireless transmission part 13 by switching of the first switch 21. The control part 23 has an analog-to-digital converter (ADC), a processor, and memory. The ADC converts an analog signal indicating the value of the voltage applied to the wireless transmission part 13 by the first switch 21 into a digital signal, and provides the processor with the value of the voltage thus converted into the digital signal. Hereinafter, the value of a voltage provided from the ADC is referred to as a voltage of the power storage part 12. The processor reads a program stored in the memory and executes the read program to implement the functions of the control part 23 to be described below. The control part 23 is an example of a power consumption control part.

Figure 2:
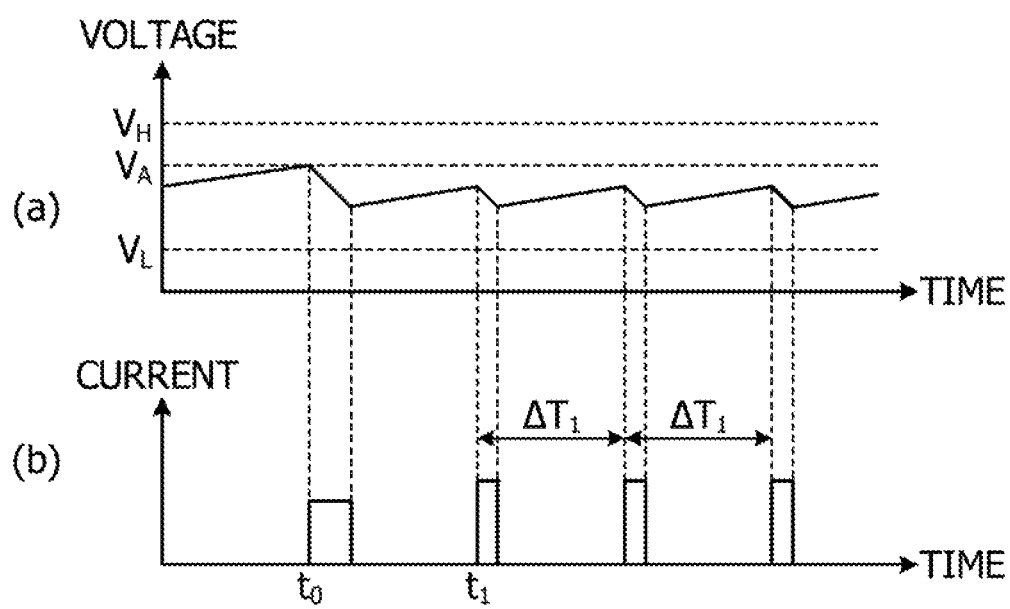
FIG. 2 is a diagram illustrating an example operation of a control part upon activation.

First, the control part 23 is activated when supplied with the power stored in the power storage part 12 by the first switch 21, and performs initialization processing including initialization of the ADC. FIG. 2 is a diagram illustrating an example operation of the control part 23 upon activation. (a) of FIG. 2 illustrates the voltage outputted from the power storage part 12, and (b) of FIG. 2 illustrates currents consumed by the wireless transmission part 13 or the control part 23.

As illustrated in (a) FIG. 2 for example, at a time point $t_0$ at which the voltage of the power storage part 12 equals or exceeds the activation voltage $V_A$, the voltage monitor part 22 controls the first switch 21 so that the first switch 21 may be brought to the ON state. Thereby, power supply to the control part 23 is started at the time point $t_0$. The control part 23 is activated by the power supply and performs initialization processing. By performing the initialization processing of the control part 23, the control part 23 consumes currents for a predetermined period from the time point $t_0$, as illustrated in (b) FIG. 2 for example.

Next, based on the value of the voltage of the power storage part 12, the control part 23 controls the power to be consumed by the wireless transmission part 13. For example, the control part 23 controls the wireless transmission part 13 so that the larger the value of the voltage of the power storage part 12, the more power the wireless transmission part 13 consumes. In the present embodiment, the control part 23 controls the operation of the wireless transmission part 13 so that the larger the value of the voltage of the power storage part 12, the more frequently the wireless transmission part 13 operates. Specifically, the control part 23 controls the operation of the wireless transmission part 13 so that the wireless transmission part 13 may be activated at a shorter interval as the value of the voltage of the power storage part 12 is larger. The reciprocal of the activation interval corresponds to the operation frequency.

In the example in (a) of FIG. 2, the values of the voltage of the power storage part 12 are below a higher threshold $V_H$ and equal to or above a lower threshold $V_L$. Thus, the control part 23 determines the activation interval of the wireless transmission part 13 to be a first interval $\Delta T_1$. Then after a time point $t_1$ at which the initialization ends, the control part 23 activates the wireless transmission part 13 at the first interval $\Delta T_1$. When activated by the control part 23, the wireless transmission part 13 wirelessly transmits a signal supplied from the signal supply part 14 using a predetermined amount of power. As a result, the wireless transmission part 13 consumes the predetermined amount of power at the first interval $\Delta T_1$, as illustrated in (b) of FIG. 2 for example. The reciprocal of the first interval $\Delta T_1$ is an example of a first frequency. Further, the higher threshold $V_H$ is an example of a value of a second voltage. Although the higher threshold $V_H$ is higher than the activation voltage $V_A$ in (a) of FIG. 2, the higher threshold $V_H$ may be lower than the activation voltage $V_A$.

When the power generation part 11 generates a large amount of power, the wireless transmission part 13 activated at the first interval $\Delta T_1$ may not be able to sufficiently consume the power generated by the power generation part 11. Thus, when the value of the voltage of the power storage part 12 is equal to or above the higher threshold $V_H$, the control part 23 changes the activation interval of the wireless transmission part 13 to a second interval $\Delta T_2$ which is shorter than the first interval $\Delta T_1$. The change of the activation interval of the wireless transmission part 13 from the first interval $\Delta T_1$ to the second interval $\Delta T_2$ increases the activation frequency of the wireless transmission part 13. The reciprocal of the second interval $\Delta T_2$ is an example of a second frequency.

Figure 3:
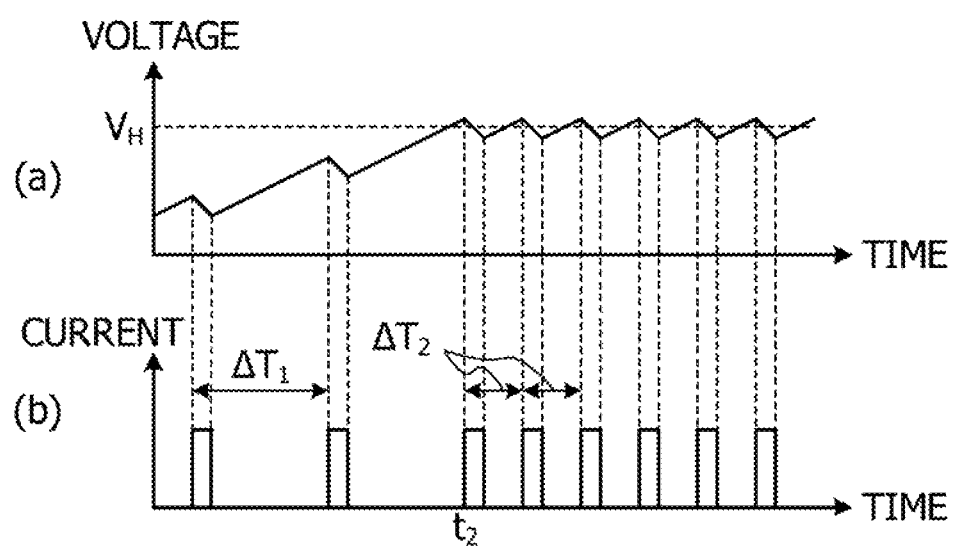
FIG. 3 is a diagram illustrating an example of how the control part operates in Embodiment 1 when voltage of a power storage part is high.

FIG. 3 is a diagram illustrating an example of how the control part 23 operates in Embodiment 1 when the voltage of the power storage part 12 is high. For example, as illustrated in (a) of FIG. 3, at a time point $t_2$ at which the value of the voltage of the power storage part 12 exceeds the higher threshold $V_H$, the control part 23 changes the activation interval of the wireless transmission part 13 to the second interval $\Delta T_2$, and activates the wireless transmission part 13 at the activation interval thus changed. As a result, as illustrated in (b) of FIG. 3 for example, the wireless transmission part 13 consumes the predetermined amount of power at the second interval $\Delta T_2$, meaning that the wireless transmission part 13 consumes more power per unit time. This suppresses an increase in the amount of power stored in the power storage part 12 even when the value of the second voltage of the power storage part 12 is larger than the higher threshold $V_H$. Consequently, a rise in the voltage of the power storage part 12 is suppressed, and the wireless transmission part 13 and the control part 23 do not receive a voltage exceeding the withstand voltages of the wireless transmission part 13 and the control part 23.

Further, when the power generation part 11 generates a small amount of power, the amount of power generated by the power generation part 11 may be insufficient to cover the power to be consumed by the wireless transmission part 13 activated at the first interval $\Delta T_1$. Thus, when the value of the voltage of the power storage part 12 falls below the lower threshold $V_L$, the control part 23 changes the activation interval of the wireless transmission part 13 to a third interval $\Delta T_3$ which is longer than the first interval $\Delta T_1$. The change of the activation interval of the wireless transmission part 13 from the first interval $\Delta T_1$ to the third interval $\Delta T_3$ decreases the activation frequency of the wireless transmission part 13.

Figure 4:
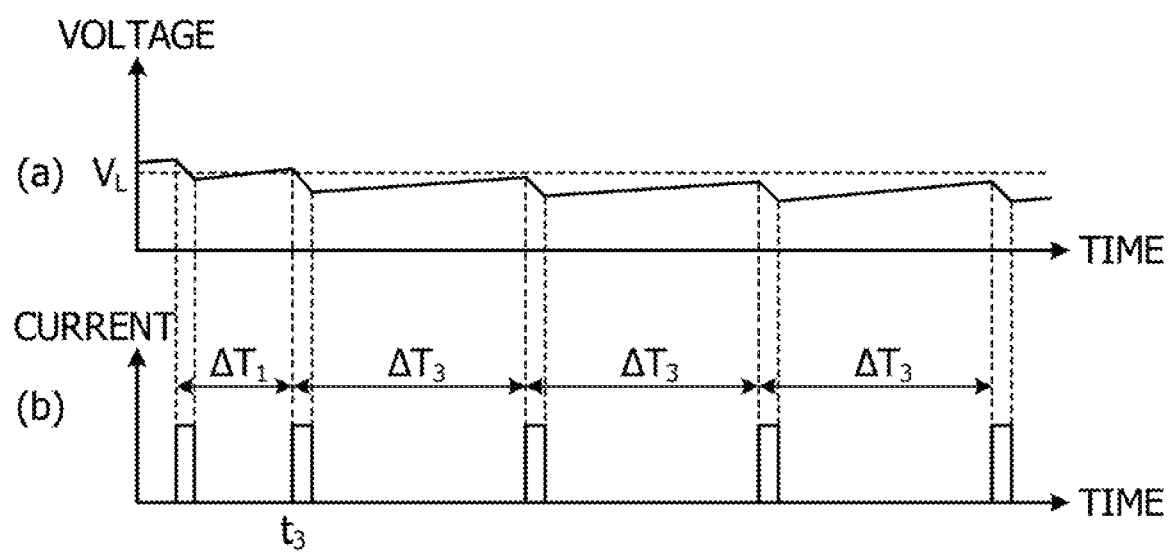
FIG. 4 is a diagram illustrating an example of how the control part operates in Embodiment 1 when the voltage of the power storage part is low.

FIG. 4 is a diagram illustrating an example of how the control part 23 operates in Embodiment 1 when the voltage of the power storage part 12 is low. For example, when the value of the voltage of the power storage part 12 falls below the lower threshold $V_L$ as illustrated in (a) of FIG. 4, the control part 23 changes the activation interval of the wireless transmission part 13 to the third interval $\Delta T_3$ and activates the wireless transmission part 13 at the activation interval thus changed. As a result, as illustrated in (b) of FIG. 4 for example, the wireless transmission part 13 consumes the predetermined amount of power at the third interval $\Delta T_3$ after a time point $t_3$, meaning that the wireless transmission part 13 consumes less power per unit time. This suppresses a decrease in the amount of power stored in the power storage part 12 even when the value of the voltage of the power storage part 12 is smaller than the lower threshold $V_L$. Consequently, a drop in the voltage of the power storage part 12 is suppressed, which enables the wireless transmission part 13 to continue wireless signal transmission longer.

If a regulator such as a DC-DC converter is used in place of the power supply control circuit 20 to supply the power in the power storage part 12 to the wireless transmission part 13, leakage currents through an overvoltage protection diode in the regulator consumes the power stored in the power storage part 12. Since the power generated by energy harvesting is minute, the power consumption by the leakage currents through the diode in the regulator hinders a sufficient amount of power for operating the wireless transmission part 13 from being stored in the power storage part 12. Thus, it is difficult to operate the wireless transmission part 13 with the minute amount of power generated by energy harvesting.

By contrast, the signal transmitter 10 according to the present embodiment does not have an element such as a diode that is connected in parallel with the power storage part 12. Thereby, the minute amount of power generated by the power generation part 11 using energy harvesting is efficiently stored in the power storage part 12. Thus, it is more likely that power sufficient for operating the wireless transmission part 13 is stored in the power storage part 12. It is therefore possible to operate the wireless transmission part 13 with the power generated by energy harvesting.

Further, after the voltage of the power storage part 12 reaches the activation voltage $V_A$, the control part 23 is activated and controls the wireless transmission part 13 based on the voltage of the power storage part 12 in such a manner that the higher the voltage of the power storage part 12, the more the wireless transmission part 13 consumes the power supplied from the power storage part 12 to the wireless transmission part 13 by the first switch 21. As a result, even when the voltage of the power storage part 12 is too high, the control part 23 and the wireless transmission part 13 do not receive overvoltage and break.

[Operation of the Signal Transmitter 10]

Figure 5:
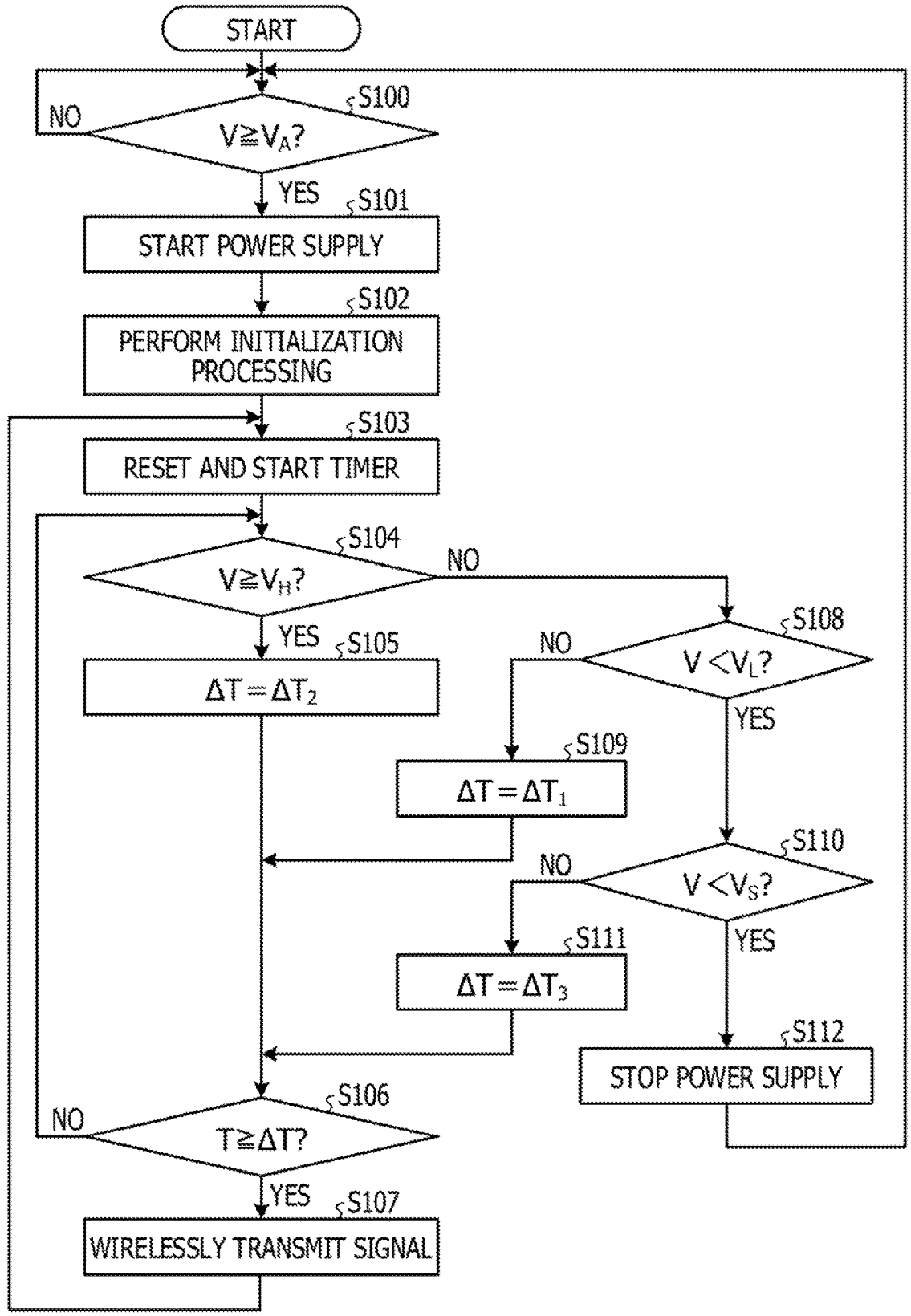
FIG. 5 is a flowchart illustrating an example operation of the signal transmitter according to Embodiment 1.

FIG. 5 is a flowchart illustrating an example operation of the signal transmitter 10 according to Embodiment 1. The signal transmitter 10 starts the operation in this flowchart at predetermined timing.

First, the voltage monitor part 22 monitors voltage V at the power storage part 12 and determines whether the voltage V at the power storage part 12 is equal to or above the activation voltage $V_A$ (S100). When the voltage V at the power storage part 12 is below the activation voltage $V_A$ (S100: No), the voltage monitor part 22 preforms the processing in Step S100 again.

When the voltage V at the power storage part 12 is equal to or above the activation voltage $V_A$ (S100: Yes), the voltage monitor part 22 controls the first switch 21 so that the first switch 21 may be brought to the ON state. Thus brought to the ON state as instructed by the voltage monitor part 22, the first switch 21 starts supplying the wireless transmission part 13 and the control part 23 with the power stored in the power storage part 12 by the power generation part 11 (S101).

Then, the control part 23 is activated by the power the supply of which has been started by the first switch 21 and performs initialization processing including initialization of the ADC (S102). Then, the control part 23 resets and starts a timer for measuring the activation interval of the wireless transmission part 13 (S103).

Next, the control part 23 determines whether the value of the voltage V at the power storage part 12 is equal to or above the higher threshold $V_H$ (S104). When the voltage V at the power storage part 12 is equal to or above the higher threshold $V_H$ (S104: Yes), the control part 23 sets the activation interval ΔT of the wireless transmission part 13 to the second interval $\Delta T_2$ (S105).

Next, the control part 23 determines whether a time T measured by the timer is equal to or above the activation interval ΔT (S106). When the time T measured by the timer is below the activation interval ΔT (S106: No), the control part 23 performs the processing depicted in Step S104 again.

When, on the other hand, the time T measured by the timer is equal to or above the activation interval ΔT (S106: Yes), the control part 23 activates the wireless transmission part 13. The wireless transmission part 13 wirelessly transmits a signal supplied from the signal supply part 14 using a predetermined amount of power (S107). Then, the control part 23 performs the processing depicted in Step S103 again.

When the value of the voltage V at the power storage part 12 is below the higher threshold $V_H$ (S104: No), the control part 23 determines whether the value of the voltage V at the power storage part 12 is below the lower threshold $V_L$ (S108). When the value of the voltage V at the power storage part 12 is equal to or above the lower threshold $V_L$ (S108: No), or in other words, when the value of the voltage V at the power storage part 12 is below the higher threshold V and equal to or above the lower threshold $V_L$, the control part 23 sets the activation interval ΔT of the wireless transmission part 13 to the first interval $\Delta T_1$ (S109). Then, the control part 23 performs the processing depicted in Step S106.

When, on the other hand, the value of the voltage V at the power storage part 12 is below the lower threshold $V_L$ (S108: Yes), the voltage monitor part 22 determines whether the voltage V at the power storage part 12 is below the stop voltage $V_S$ (S110). When the voltage V at the power storage part 12 is equal to or above the stop voltage $V_S$ (S110: No), or in other words, when the voltage V at the power storage part 12 is below the lower threshold $V_L$ and equal to or above the stop voltage $V_S$, the control part 23 sets the activation interval ΔT of the wireless transmission part 13 to the third interval $\Delta T_3$ (S111). Then, the control part 23 performs the processing depicted in the Step S106.

When, on the other hand, the voltage V at the power storage part 12 is below the stop voltage $V_S$ (S110: Yes), the voltage monitor part 22 controls the first switch 21 so that the first switch 21 may be brought to the OFF state. Thus brought to the OFF state as instructed by the voltage monitor part 22, the first switch 21 stops supplying the wireless transmission part 13 and the control part 23 with the power stored in the power storage part 12 (S112). Then, the voltage monitor part 22 performs the processing depicted in Step S100 again.

[Advantageous Effects of Embodiment 1]

As described above, the signal transmitter 10 of the present embodiment has the signal supply part 14, the wireless transmission part 13, the power generation part 11, the power storage part 12, the first switch 21, the voltage monitor part 22, and the control part 23. The signal supply part 14 supplies a signal to the wireless transmission part 13. The wireless transmission part 13 wirelessly transmits the signal supplied from the signal supply part 14. The power generation part 11 generates power using energy harvesting. The power storage part 12 stores the power generated by the power generation part 11. The first switch 21 switches between supplying and not supplying the wireless transmission part 13 with the power stored in the power storage part 12. The voltage monitor part 22 monitors the voltage of the power storage part 12 and when the voltage of the power storage part 12 is equal to or above the activation voltage $V_A$, controls the first switch 21 so that the wireless transmission part 13 may be supplied with the power stored in the power storage part 12. Thereby, the signal transmitter 10 of the present embodiment enables the wireless transmission part 13 to be operated with the power generated by energy harvesting. Further, the signal transmitter 10 of the present embodiment is able to achieve overvoltage protection of the wireless transmission part 13.

Moreover, in the above embodiment, when the value of a voltage corresponding to the power stored in the power storage part 12 is below the higher threshold $V_H$, the control part 23 controls the wireless transmission part 13 so that the wireless transmission part 13 may operate at the first frequency. Further, when the value of a voltage corresponding to the power stored in the power storage part 12 is equal to or above the higher threshold $V_H$, the control part 23 controls the wireless transmission part 13 so that the wireless transmission part 13 may operate at the second frequency which is higher than the first frequency. Thereby, even if the same amount of power is consumed by one operation of the wireless transmission part 13, the control part 23 is able to increase an average amount of power consumed by the signal transmitter 10 per unit time.

Figure 6:
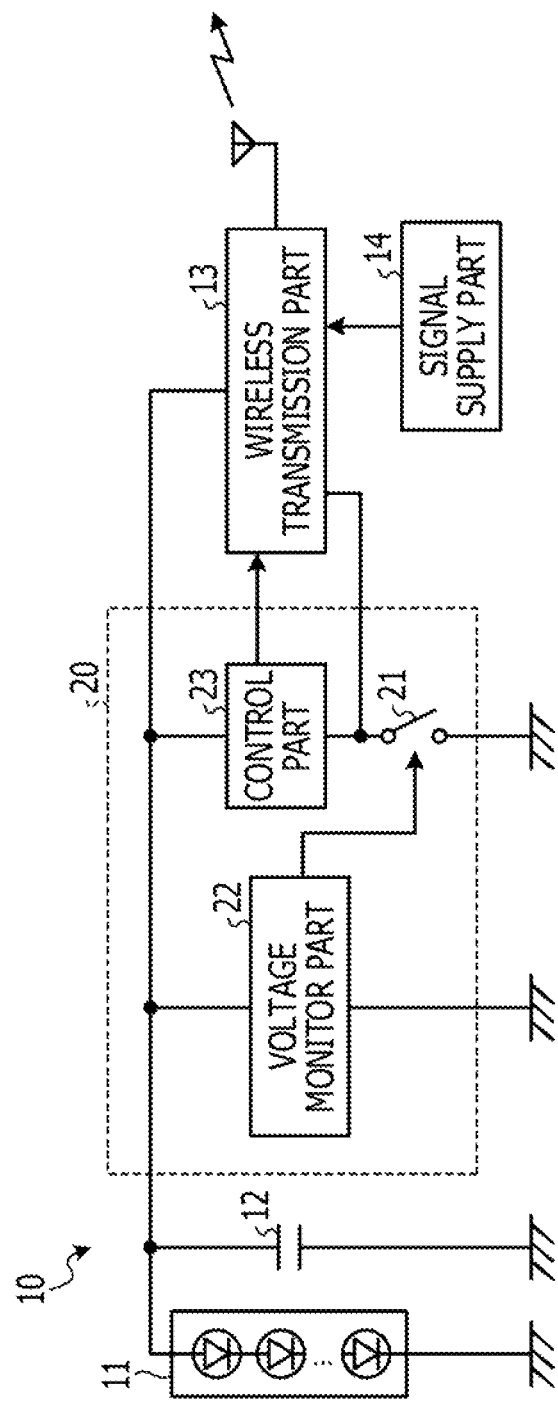
FIG. 6 is a block diagram illustrating another example of the signal transmitter according to Embodiment 1.

Note that the first switch 21 in Embodiment 1 above is, as illustrated in FIG. 1 for example, disposed between the power storage part 12 and each of the control part 23 and the wireless transmission part 13. However, the technique disclosed herein is not limited to this. The first switch 21 may be disposed between the ground and each of the control part 23 and the wireless transmission part 13 as illustrated in FIG. 6 for example, as long as the first switch 21 is designed to switch between supplying and not supplying the control part 23 and the wireless transmission part 13 with the power stored in the power storage part 12. FIG. 6 is a block diagram illustrating another example of the signal transmitter 10 according to Embodiment 1.

Embodiment 2

In Embodiment 1, the control part 23 increases the average amount of power consumed by the wireless transmission part 13 per unit time by increasing the activation frequency of the wireless transmission part 13 when the voltage of the power storage part 12 is equal to or above the higher threshold $V_H$. In the present embodiment, the control part 23 increases the average amount of power consumed by the wireless transmission part 13 per unit time by increasing the transmission power used by the wireless transmission part 13 when the voltage of the power storage part 12 is equal to or above the higher threshold $V_H$. Note that the configuration of the signal transmitter 10 according to the present embodiment is the same as that of Embodiment 1 Illustrated in FIG. 1 except for the points to be described below, and are therefore not described in detail.

Figure 7:
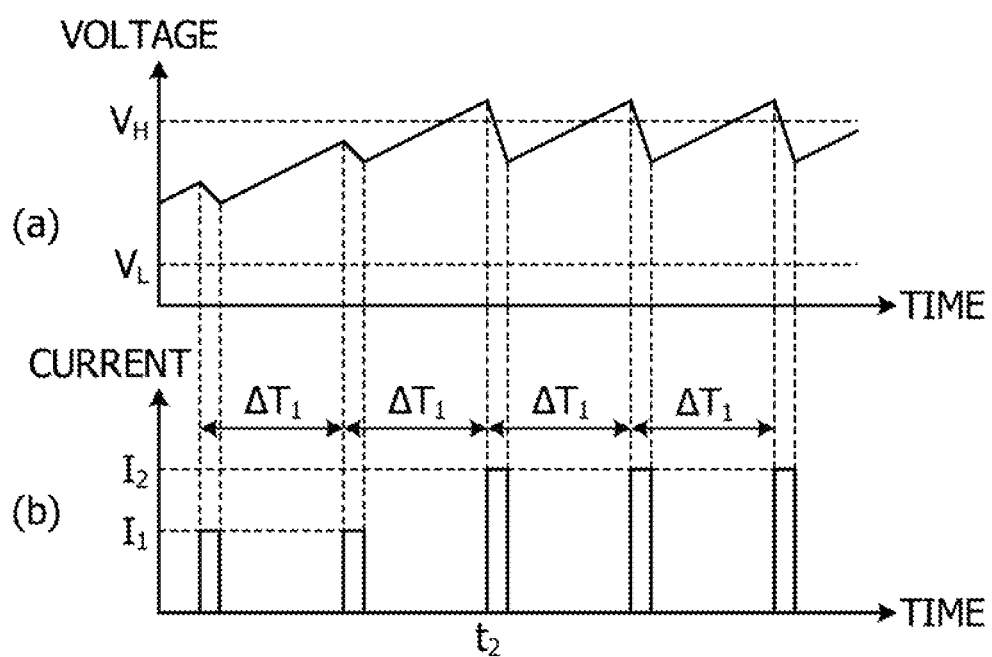
FIG. 7 is a diagram illustrating an example of how the control part operates in Embodiment 2 when the voltage of the power storage part is high.

FIG. 7 is a diagram illustrating an example of how the control part 23 operates in Embodiment 2 when the voltage of the power storage part 12 is high. When the value of the voltage of the power storage part 12 is below the higher threshold $V_H$ and equal to or above the lower threshold $V_L$, the control part 23 sets the transmission power used by the wireless transmission part 13 to a first power $P_1$. Then, the control part 23 activates the wireless transmission part 13 at the first interval $\Delta T_1$ and instructs the wireless transmission part 13 to use the set transmission power. The wireless transmission part 13 wirelessly transmits a signal supplied from the signal supply part 14 using the set transmission power. Thereby, as illustrated in (b) of FIG. 7 for example, when the value of the voltage of the power storage part 12 is below the higher threshold $V_H$ and equal to or above the lower threshold $V_L$, the wireless transmission part 13 consumes first current $I_1$ by the wireless transmission using the first power $P_1$. Hereinbelow, a first consumption amount is defined as an average amount of power consumed by the wireless transmission part 13 per unit time when the value of the voltage of the power storage part 12 is below the higher threshold $V_H$ and equal to or above the lower threshold $V_L$, and the wireless transmission part 13 is set to perform wireless transmission at the first interval $\Delta T_1$.

On the other hand, when the value of the voltage of the power storage part 12 is above or below the higher threshold $V_H$ as illustrated in (a) of FIG. 7 for example, the control part 23 sets the transmission power used by the wireless transmission part 13 to a second power $P_2$ which is larger than the first power $P_1$. Then, at a time point $t_2$ which coincides with the first interval $\Delta T_1$, the control part 23 activates the wireless transmission part 13 and instructs the wireless transmission part 13 to use the transmission power thus set. The wireless transmission part 13 wirelessly transmits a signal supplied from the signal supply part 14 using the set transmission power. Thereby, as illustrated in (b) of FIG. 7 for example, when the value of the voltage of the power storage part 12 is equal to or above the higher threshold $V_H$, the wireless transmission part 13 consumes second current $I_2$ which is larger than the first current $I_1$ by the wireless transmission using the second power $P_2$. A second consumption amount is defined as an average amount of power consumed by the wireless transmission part 13 per unit time when the value of the voltage of the power storage part 12 is equal to or above the higher threshold $V_H$ and the wireless transmission part 13 is set to perform wireless transmission at the first interval $\Delta T_1$. The second consumption amount is larger than the first consumption amount described earlier.

By thus increasing the transmission power used by the wireless transmission part 13 when the value of the voltage of the power storage part 12 is equal to or above the higher threshold $V_H$, the control part 23 is able to suppress a rise in the voltage of the power storage part 12. Thus, the wireless transmission part 13 and the control part 23 do not receive a voltage exceeding the withstand voltages of the wireless transmission part 13 and the control part 23.

Figure 8:
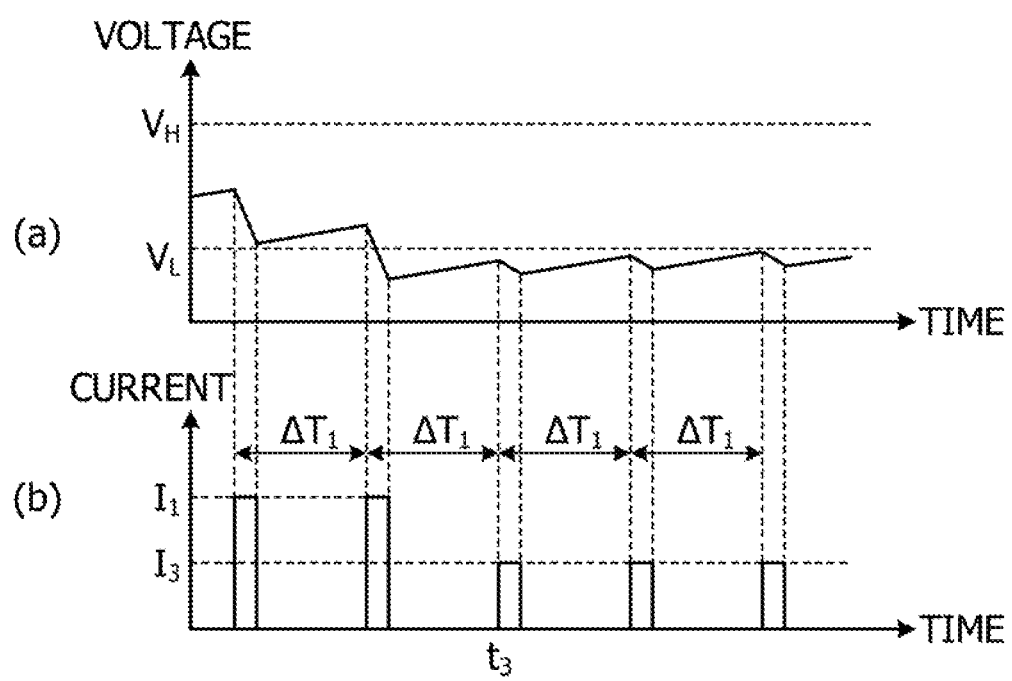
FIG. 8 is a diagram illustrating an example of how the control part operates in Embodiment 2 when the voltage of the power storage part is low.

FIG. 8 is a diagram illustrating an example of how the control part 23 operates in Embodiment 2 when the voltage of the power storage part 12 is low. For example, when the value of the voltage of the power storage part 12 is below the lower threshold $V_L$ as illustrated in (a) of FIG. 8 for example, the control part 23 sets the transmission power used by the wireless transmission part 13 to a third power $P_3$ which is smaller than the first power $P_1$. Then, at a time point $t_3$ which coincides with the first interval $\Delta T_1$, the control part 23 activates the wireless transmission part 13 and instructs the wireless transmission part 13 to use the transmission power thus set. The wireless transmission part 13 wirelessly transmits a signal supplied from the signal supply part 14 using the set transmission power. Thereby, when the value of the voltage of the power storage part 12 is below the lower threshold $V_L$ as illustrated in (b) of FIG. 8 for example, the wireless transmission part 13 consumes third current $I_3$ by the wireless transmission using the third power $P_3$, the third current $I_3$ being smaller than the first current $I_1$.

By thus decreasing the transmission power used by the wireless transmission part 13 when the value of the voltage of the power storage part 12 is below the lower threshold $V_L$, the control part 23 is able to cause the power stored in the power storage part 12 to be consumed less. This helps allow the wireless transmission part 13 to continue wireless signal transmission longer at the first interval $\Delta T_1$.

Further, by thus changing the transmission power used by the wireless transmission part 13, the control part 23 is able to change the amount of power consumed by the wireless transmission part 13 without changing the intervals at which the wireless transmission part 13 transmits signals. Thus, even when it is difficult to change the signal transmission intervals, such as when the signal transmission interval is predefined in the specifications, the control part 23 is able to control an average amount of power to be consumed by the wireless transmission part 13 per unit time.

[Operation of the Signal Transmitter 10]

Figure 9:
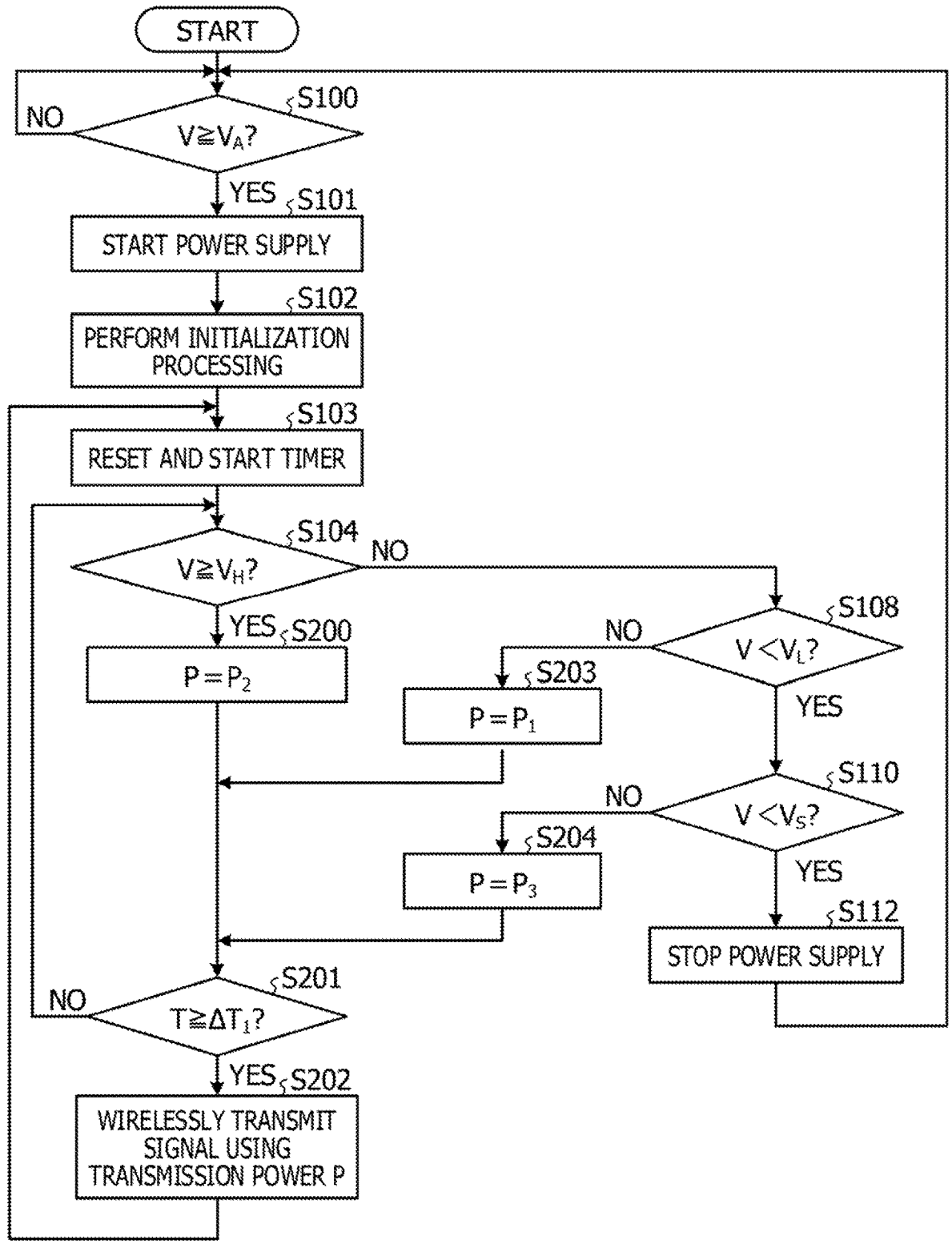
FIG. 9 is a flowchart illustrating an example operation of the signal transmitter according to Embodiment 2.

FIG. 9 is a flowchart illustrating an example operation of the signal transmitter 10 according to Embodiment 2. The signal transmitter 10 starts the operation of this flowchart at predetermined timing. Note that the processing in the steps in FIG. 9 that are denoted by the same numbers as those in FIG. 5 are the same as those illustrated using FIG. 5 except for the points to be described below, and are therefore not described in detail.

When the value of the voltage V at the power storage part 12 is equal to or above the higher threshold $V_H$(S104: Yes), the control part 23 sets the value of the second power $P_2$ to a variable P indicative of the transmission power to be used by the wireless transmission part 13 (S200). Then, the control part 23 determines whether the time T measured by the timer is equal to or above the first interval $\Delta T_1$ (S201). When the time T measured by the timer is below the first interval $\Delta T_1$ (S201: No), the control part 23 performs the processing depicted in Step S104 again.

On the other hand, when the time T measured by the timer is equal to or above the first interval $\Delta T_1$ (S201: Yes), the control part 23 activates the wireless transmission part 13 and instructs the wireless transmission part 13 to use the transmission power indicated by the variable P. The wireless transmission part 13 wirelessly transmits a signal supplied from the signal supply part 14 using the transmission power indicated by the variable P (S202). Then, the control part 23 performs the processing depicted in Step S103 again.

When the value of the voltage V at the power storage part 12 is equal to or above the lower threshold $V_L$ (S108: No), or in other words, when the value of the voltage V at the power storage part 12 is below the higher threshold $V_H$ and equal to or above the lower threshold $V_L$, the control part 23 sets the first power $P_1$ to the variable P (S203). Then, the control part 23 performs the processing depicted in Step S201.

When the voltage V at the power storage part 12 is equal to or above the stop voltage $V_S$ (S110: No), or in other words, when the voltage V at the power storage part 12 is below the lower threshold $V_L$ and equal to or above the stop voltage $V_S$, the control part 23 sets the third power $P_3$ to the variable P (S204). Then, the control part 23 performs the processing depicted in Step S201.

[Advantageous Effects of Embodiment 2]

As described above, when the value of a voltage corresponding to the power stored in the power storage part 12 is below the higher threshold $V_H$, the control part 23 of the present embodiment controls the wireless transmission part 13 so that the wireless transmission part 13 may consume power in the first consumption amount. Further, when the value of a voltage corresponding to the power stored in the power storage part 12 is equal to or above the higher threshold $V_H$, the control part 23 controls the wireless transmission part 13 so that the wireless transmission part 13 may consume power in the second consumption amount, which is larger than the first consumption amount. Thereby, the signal transmitter 10 of the present embodiment is able to not only operate the wireless transmission part 13 using the power generated by energy harvesting, but also achieve overvoltage protection of the wireless transmission part 13. Furthermore, even when it is difficult to change the signal transmission interval, the control part 23 is able to control an average amount of power consumed by the wireless transmission part 13 per unit time based on the voltage of the power storage part 12.

Embodiment 3

In the Embodiments 1 and 2 described above, when the voltage of the power storage part 12 is equal to or above the higher threshold $V_H$, the operation of the wireless transmission part 13 is controlled to suppress a rise in the voltage of the power storage part 12. However, when the power generation part 11 generates a large amount of power, power consumption by the wireless transmission part 13 may be insufficient to suppress a rise in the voltage of the power storage part 12. Thus, in the present embodiment, when the voltage of the power storage part 12 reaches an upper-limit voltage $V_H'$ which is higher than the higher threshold $V_H$, a circuit for consuming power in the power storage part 12 is additionally operated to consume more power in the power storage part 12. This makes it unlikely that the signal transmitter 10 breaks due to overvoltage caused by a rise in the voltage of the power storage part 12.

Figure 10:
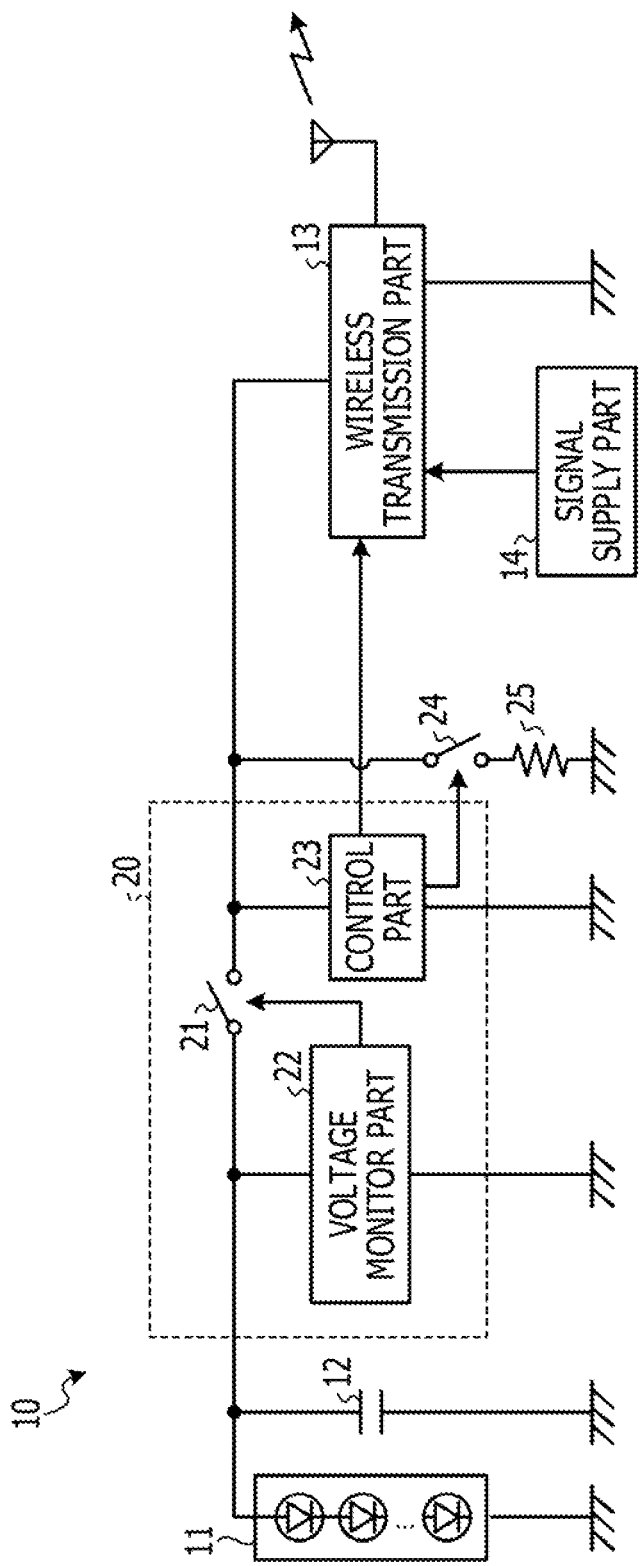
FIG. 10 is a block diagram illustrating an example of a signal transmitter according to Embodiment 3.

FIG. 10 is a block diagram illustrating an example of the signal transmitter 10 according to Embodiment 3. The signal transmitter 10 according to the present embodiment has, as illustrated in FIG. 10 for example, the power generation part 11, the power storage part 12, the wireless transmission part 13, the signal supply part 14, the power supply control circuit 20, a second switch 24, and a power consumption circuit 25. Note that the blocks in FIG. 10 that are denoted by the same reference numerals as those in FIG. 1 have the same functions as those illustrated using FIG. 1 and are therefore not described in detail.

The second switch 24 switches between supplying and not supplying the power consumption circuit 25 with the power stored in the power storage part 12 by the power generation part 11. The switching by the second switch 24 is controlled by the control part 23. The second switch 24 is preferably an element that allows little leak current to flow in the OFF state, such as an MEMS switch for example. The second switch 24 is an example of a second switch part.

The power consumption circuit 25 consumes power supplied from the power storage part 12 via the second switch 24. In the present embodiment, the power consumption circuit 25 is a resistance element. Note that the power consumption circuit 25 may be an overvoltage protection circuit such as a diode. In the present embodiment, the wireless transmission part 13, the second switch 24, and the power consumption circuit 25 are an example of a functional circuit.

Figure 11:
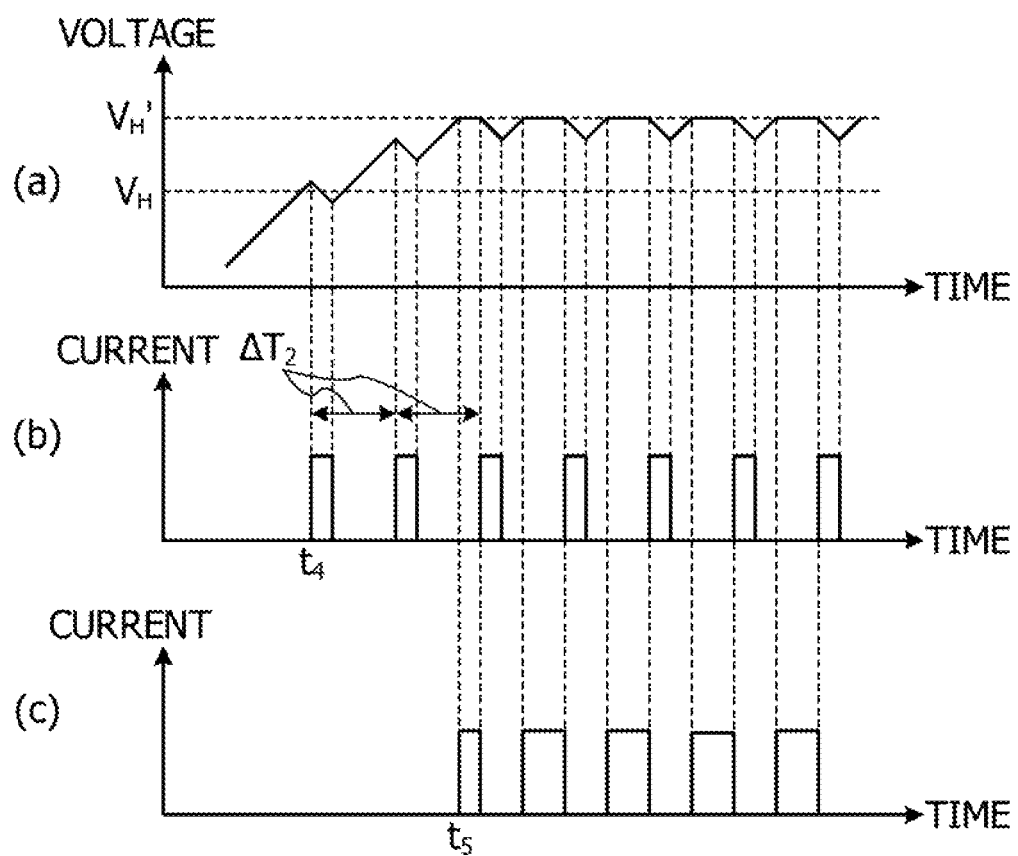
FIG. 11 is a diagram illustrating an example of how the control part operates in Embodiment 3 when the voltage of the power storage part is high.

FIG. 11 is a diagram illustrating how the control part 23 operates in Embodiment 3 when the voltage of the power storage part 12 is high. The vertical axis in (b) of FIG. 11 represents the current consumed by the wireless transmission part 13, and the vertical axis in (c) of FIG. 11 represents the current consumed by the power consumption circuit 25. As illustrated in (a) of FIG. 11 for example, at a time point $t_4$ at which the value of the voltage of the power storage part 12 exceeds the higher threshold $V_H$, the control part 23 changes the activation interval of the wireless transmission part 13 to the second interval $\Delta T_2$ and activates the wireless transmission part 13 at the activation interval thus changed. As a result, the wireless transmission part 13 consumes a predetermined amount of current at the second interval $\Delta T_2$ as illustrated in (b) of FIG. 11 for example.

However, in the example in (a) of FIG. 11, the power generation part 11 generates a large amount of power, and hence the voltage of the power storage part 12 keeps rising even if the power in the power storage part 12 is consumed by the activation of the wireless transmission part 13 at the second interval $\Delta T_2$. Then, at a time point $t_5$, the control part 23 detects that the voltage of the power storage part 12 has reached the upper-limit voltage $V_H'$, and controls the second switch 24 so that the power consumption circuit 25 may be supplied with the power stored in the power storage part 12. The upper-limit voltage $V_H'$ is set to a value lower than any of the withstand voltages of the components of the signal transmitter 10 and higher than the higher threshold $V_H$. Further, in the present embodiment, the upper-limit voltage $V_H'$ is higher than the activation voltage $V_A$. The upper-limit voltage $V_H'$ is an example of a third voltage.

The second switch 24 is changed from the OFF state to the ON state as instructed by the control part 23 and supplies the power consumption circuit 25 with the power stored in the power storage part 12. As a result, as illustrated in (c) of FIG. 11 for example, the current supplied from the power storage part 12 is consumed by the power consumption circuit 25. Then, when the voltage of the power storage part 12 falls below the upper-limit voltage $V_H'$, the control part 23 controls the second switch 24 so that the power consumption circuit 25 may not be supplied with the power stored in the power storage part 12. However, since the wireless transmission part 13 is not activated until the timing coinciding with the second interval $\Delta T_2$ comes, the voltage of the power storage part 12 rises again and reaches and exceeds the upper-limit voltage $V_H'$.

When the voltage of the power storage part 12 thus reaches the upper-limit voltage $V_H'$, the second switch 24 is turned on and off repeatedly until the next timing to activate the wireless transmission part 13, so that the voltage of the power storage part 12 is maintained almost at the upper-limit voltage $V_H'$ as illustrated in (a) of FIG. 11 for example. Thereby, the control part 23 allows the voltage of the power storage part 12 not to reach the withstand voltage of any of the components of the signal transmitter 10. The control part 23 makes it unlikely that the signal transmitter 10 breaks due to overvoltage caused by a rise in the voltage of the power storage part 12.

[Operation of the Signal Transmitter 10]

Figure 12:
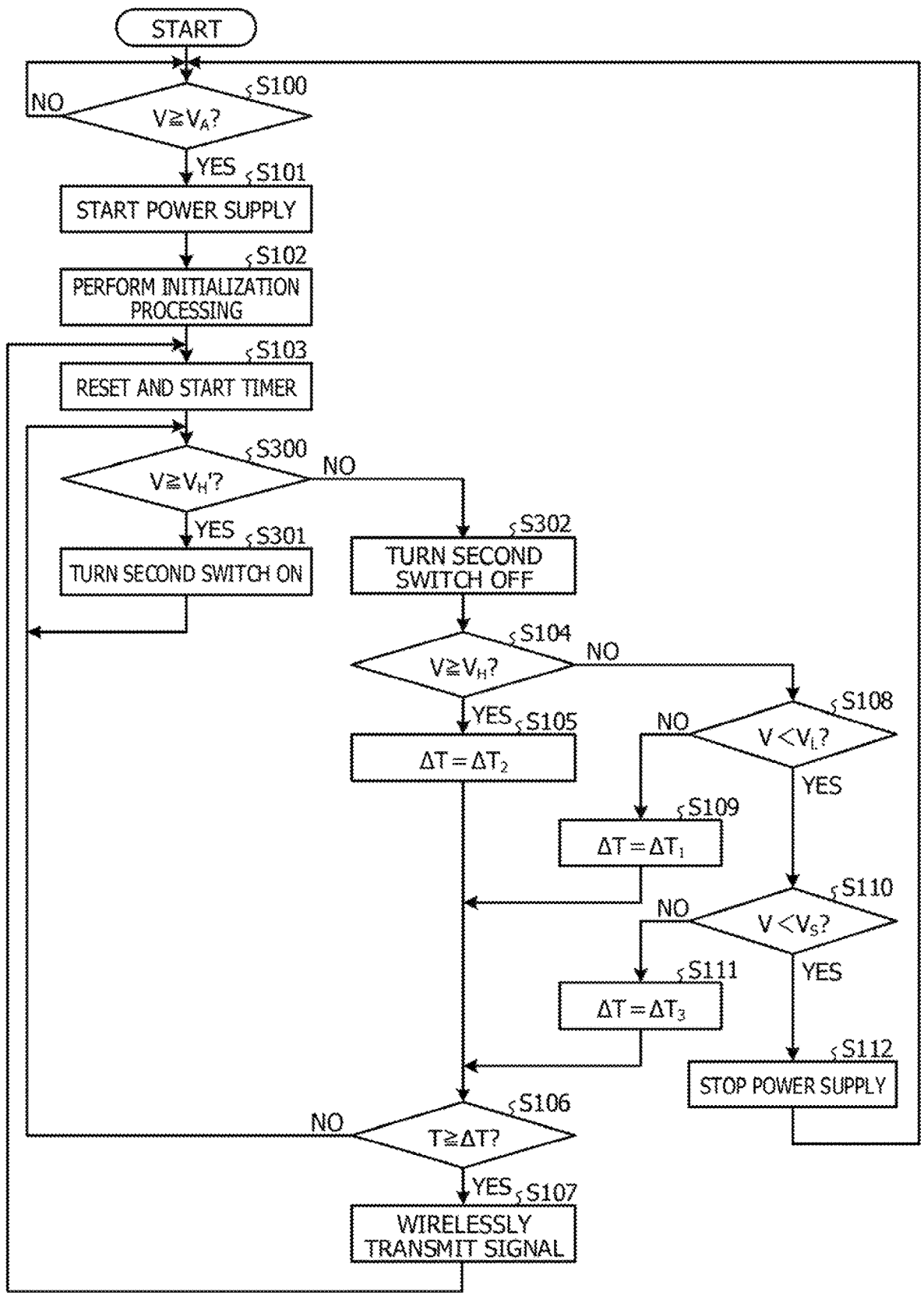
FIG. 12 is a flowchart illustrating an example operation of the signal transmitter according to Embodiment 3.

FIG. 12 is a flowchart illustrating an example operation of the signal transmitter 10 according to Embodiment 3. The signal transmitter 10 starts the operation in this flowchart at predetermined timing. Note that processing in the steps in FIG. 12 that are denoted by the same numbers as those in FIG. 5 are the same as those illustrated using FIG. 5 except for the points to be described below, and are therefore not described in detail.

After resetting and starting the timer for measuring the activation interval of the wireless transmission part 13 in Step S103, the control part 23 determines whether the value of the voltage V at the power storage part 12 is equal to or above the upper-limit voltage $V_H'$ (S300). When the value of the voltage V at the power storage part 12 is equal to or above the upper-limit voltage $V_H'$ (S300: Yes), the control part 23 controls the second switch 24 so that the power consumption circuit 25 may be supplied with the power stored in the power storage part 12. Thus changed from the OFF state to the ON state, the second switch 24 supplies the power consumption circuit 25 with the power stored in the power storage part 12 (S301). Then, the control part 23 performs the processing in Step S300 again.

When the value of the voltage V at the power storage part 12 is below the upper-limit voltage $V_H'$ (S300: No), the control part 23 controls the second switch 24 so that the power consumption circuit 25 may not be supplied with the power stored in the power storage part 12. Thus changed from the ON state to the OFF state, the second switch 24 stops supplying the power stored in the power storage part 12 to the power consumption circuit 25 (S302). Then, the control part 23 executes the processing in Step S104.

[Advantageous Effects of Embodiment 3]

As described above, when the voltage of the power storage part 12 reaches the upper-limit voltage $V_H'$ which is higher than the higher threshold $V_H$, the signal transmitter 10 of the present embodiment supplies the power consumption circuit 25 with the power in the power storage part 12 so that the power consumption circuit 25 may consume the power stored in the power storage part 12. Thereby, the signal transmitter 10 makes it unlikely that the signal transmitter 10 breaks due to overvoltage caused by a rise in the voltage of the power storage part 12.

Figure 13:
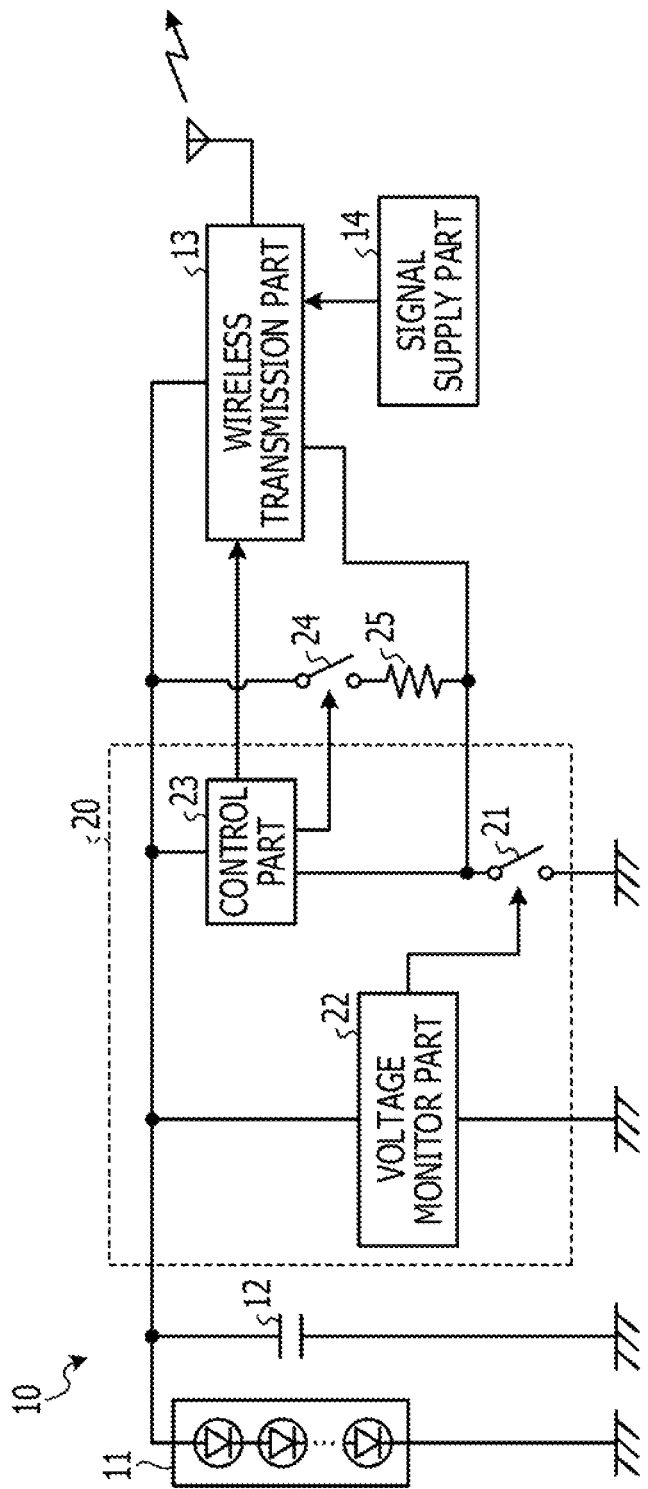
FIG. 13 is a block diagram illustrating another example of the signal transmitter according to Embodiment 3.

In Embodiment 3 described above, the first switch 21 is disposed between the power storage part 12 and each of the wireless transmission part 13, the control part 23, and the second switch 24 as illustrated in FIG. 10 for example. However, the first switch 21 may be disposed at a position other than that illustrated in FIG. 10 as long as the first switch 21 is able to switch between supplying and not supplying the wireless transmission part 13, the control part 23, and the second switch 24 with the power stored in the power storage part 12. For example, the first switch 21 may be disposed between the ground and each of the wireless transmission part 13, the control part 23, and the power consumption circuit 25 as illustrated in FIG. 13. FIG. 13 is a block diagram illustrating another example of the signal transmitter 10 according to Embodiment 3.

Embodiment 4

In Embodiment 3, when the voltage of the power storage part 12 is equal to or above the higher threshold $V_H$, the activation frequency of the wireless transmission part 13 is increased, and further, when the voltage of the power storage part 12 reaches the upper-limit voltage $V_H'$, the power consumption circuit 25 is operated to consume more power in the power storage part 12. By contrast, in Embodiment 4, when the voltage of the power storage part 12 is equal to or above the higher threshold $V_H$, the transmission power used by the wireless transmission part 13 is increased to increase the average amount of power consumed by the wireless transmission part 13 per unit time. This makes it unlikely that the signal transmitter 10 breaks due to overvoltage caused by a rise in the voltage of the power storage part 12, even when it is difficult to change the signal transmission intervals.

Other Embodiments

Note that the technique disclosed herein is not limited to the embodiments set forth above, and is variously modifiable without departing from the gist thereof.

For example, the power consumption circuit 25 is for example a resistance element with a fixed resistance value in Embodiment 3, but the technique disclosed herein is not limited to this. The power consumption circuit 25 may be a variable resistance element whose resistance is switchable among difference resistance values. In this case, the control part 23 may control the second switch 24 so that the higher the voltage of the power storage part 12 which is below the upper-limit voltage $V_H'$ and equal to or above the higher threshold $V_H$, the smaller the resistance value of the power consumption circuit 25.

Figure 14A:
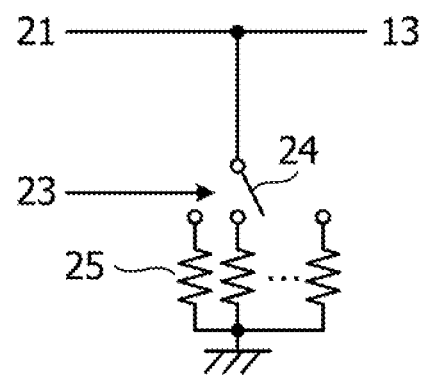
FIGS. 14A and 14B are diagrams illustrating another example of a power consumption circuit.
Figure 14B:
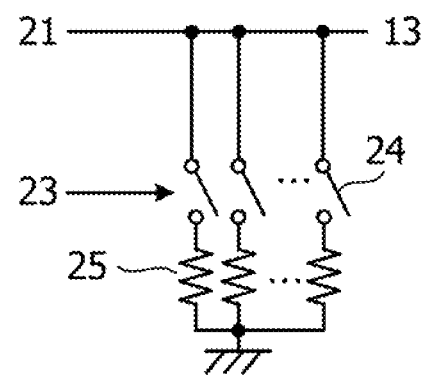

Specifically, the power consumption circuit 25 may be configured as illustrated in FIGS. 14A and 14B for example. FIGS. 14A and 14B are diagrams illustrating another example of the power consumption circuit 25. As illustrated in FIG. 14A for example, the power consumption circuit 25 has a plurality of resistance elements having different resistance values. In this case, the control part 23 controls the second switch 24 so that a resistance element with a lower resistance value may be connected when the voltage of the power storage part 12 which is below the upper-limit voltage $V_H'$ and equal to or above the higher threshold $V_H$ is higher.

Alternatively, as illustrated in FIG. 14B for example, the power consumption circuit 25 may have a plurality of resistance elements, with the second switch 24 being disposed for each of the resistance elements. In this case, the control part 23 controls the second switches 24 so that the higher the voltage of the power storage part 12, the more resistance elements are connected.

Further, in the embodiments described above, the control part 23 controls power to be consumed by the wireless transmission part 13, the power being supplied from the power storage part 12 to the wireless transmission part 13 via the first switch 21, depending on whether the voltage of the power storage part 12 is equal to or above a predetermined voltage. However, the technique disclosed herein is not limited to this. For example, the control part 23 calculates the amount of charge stored in the power storage part 12 based on the capacity of the power storage part 12 and a voltage corresponding to the power stored in the power storage part 12. Then, the control part 23 controls the operation of the wireless transmission part 13 so that the larger the amount of charge calculated, the more the wireless transmission part 13 consumes the power supplied from the power storage part 12 to the wireless transmission part 13 by the switching of the first switch 21. As a result, the signal transmitter 10 is able to not only operate the wireless transmission part 13 with the power generated by energy harvesting, but also achieve overvoltage protection of the wireless transmission part 13. In addition, voltage fluctuations at the power storage part 12 are reduced, which allows more stable operation of the signal transmitter 10.

Moreover, the embodiments described above may be employed in combination. For example, the control part 23 may perform the shortening of the activation interval of the wireless transmission part 13 and the increasing of the transmission power used by the wireless transmission part 13 when the value of the voltage of the power storage part 12 is equal to or above the higher threshold $V_H$, and cause the power consumption circuit 25 to consume the power in the power storage part 12 when the voltage of the power storage part 12 reaches the upper-limit threshold $V_H'$. The same applies to when the voltage of the power storage part 12 is low. Specifically, the wireless transmission part 13 may perform the extending of the activation interval of the wireless transmission part 13 and the decreasing of the transmission power used by the wireless transmission part 13 when the voltage of the power storage part 12 is below the lower threshold $V_L$.

Moreover, if Embodiment 1 and Embodiment 2 are combined, for example, two different higher thresholds $V_H$ may be set. In this case, the control part 23 performs any one of the shortening of the activation interval of the wireless transmission part 13 and the increasing of the transmission power used by the wireless transmission part 13 when the value of the voltage of the power storage part 12 is equal to or above the smaller one of the higher thresholds $V_H$. Then, the control part 23 performs the other one of the shortening of the activation interval of the wireless transmission part 13 and the increasing of the transmission power used by the wireless transmission part 13 when the value of the voltage of the power storage part 12 is equal to or above the larger one of the higher thresholds $V_H$.

Similarly, two different lower thresholds V may be set to be used when the power storage part 12 is low. In this case, the control part 23 performs any one of the extending of the activation interval of the wireless transmission part 13 and the decreasing of the transmission power used by the wireless transmission part 13 when the value of the voltage of the power storage part 12 is below the larger one of the lower thresholds $V_L$. Then, the control part 23 performs the other one of the extending of the activation interval of the wireless transmission part 13 and the decreasing of the transmission power used by the wireless transmission part 13 when the value of the voltage of the power storage part 12 is below the smaller one of the lower thresholds $V_L$.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A power supply control circuit comprising:
    a power storage that stores power generated by energy harvesting;
    a function circuit that operates a specific function;
    a first switch allocated between the power storage and the function circuit and supplies or not supplies the power to the function circuit;
    a supply controller that monitors a voltage corresponding to the power stored in the power storage, and when the voltage of the power storage is equal to or above a first voltage, controls the first switch so that the function circuit is supplied with the power stored in the power storage; and
    a power consumption controller that performs suppression processing when the voltage of the power storage is higher than a threshold, the suppression processing including suppressing a rise in the power stored in the power storage by controlling an operational mode of the function circuit so as to increase an amount of power consumed by the function circuit per unit time.

2. The power supply control circuit according to claim 1, wherein
    the power consumption controller controls the power to be consumed by the function circuit by
    when the voltage of the power storage is below a second voltage, controlling the function circuit so that the function circuit is operated at a first frequency, and
    when the voltage of the power storage is equal to or above the second voltage, controlling the function circuit so that the function circuit is operated at a second frequency which is higher than the first frequency.

3. The power supply control circuit according to claim 1, wherein
    when the voltage of the power storage is below a second voltage, the power consumption controller controls the function circuit so that the function circuit is operated by consuming power in a first consumption amount, and
    when the voltage of the power storage is equal to or above the second voltage, the power consumption controller controls the function circuit so that the function circuit is operated by consuming power in a second consumption amount which is larger than the first consumption amount.

4. The power supply control circuit according to claim 1, wherein
    the power storage is a capacitor, and
    the power consumption controller calculates an amount of charge stored in the power storage based on the voltage of the power storage and a capacity of the power storage, and controls the function circuit so that the larger the amount of charge calculated is, the more the function circuit consumes the power supplied from the power storage to the function circuit by switching of the first switch.

5. The power supply control circuit according to claim 1, wherein
    the function circuit includes
    a power consumption circuit that consumes the power supplied from the power storage to the function circuit by switching of the first switch, and
    a second switch that switches between supplying and not supplying the power consumption circuit with the power stored in the power storage, and the power consumption controller controls the second switch so that the power consumption circuit is supplied with the power stored in the power storage when the voltage of the power storage is equal to or above a third voltage which is larger than the first voltage.

6. A wireless module comprising:
a wireless transmitter that wirelessly transmits a predetermined signal;
a power storage that stores power generated by energy harvesting;
a switch that switches between supplying and not supplying the wireless transmitter with the power stored in the power storage;
a supply controller that monitors a voltage corresponding to the power stored in the power storage, and when the voltage of the power storage is equal to or above a predetermined voltage, controls the switch so that the wireless transmitter is supplied with the power stored in the power storage; and
a power consumption controller that performs suppression processing when the voltage of the power storage is higher than a threshold, the suppression processing including suppressing a rise in the power stored in the power storage by controlling an operational mode of the wireless transmitter so as to increase an amount of power consumed by the wireless transmitter per unit time.

7. A signal transmitter comprising:
a signal supply that supplies a signal;
a wireless transmitter that wirelessly transmits the signal supplied from the signal supply;
a power generator that generates power by energy harvesting;
a power storage that stores the power generated by the power generator;
a switch allocated between the power storage and the wireless transmitter and supplies or not supplies the power to the wireless transmitter;
a supply controller that monitors a voltage corresponding to the power stored in the power storage, and when the voltage of the power storage is equal to or above a first voltage, controls the switch so that the wireless transmitter is supplied with the power stored in the power storage; and
a power consumption controller that performs suppression processing when the voltage of the power storage is higher than a threshold, the suppression processing including suppressing a rise in the power stored in the power storage by controlling an operational mode of the wireless transmitter so as to increase an amount of power consumed by the wireless transmitter per unit time.

* * * * *